United States Patent
Hamburgen

[19]

[11] Patent Number: 5,885,853
[45] Date of Patent: Mar. 23, 1999

[54] HOLLOW CHIP PACKAGE AND METHOD OF MANUFACTURE

[75] Inventor: William Riis Hamburgen, Menlo Park, Calif.

[73] Assignee: Digital Equipment Corporation, Maynard, Mass.

[21] Appl. No.: 979,552

[22] Filed: Nov. 18, 1992

Related U.S. Application Data

[62] Division of Ser. No. 725,376, Jun. 27, 1991, abandoned, which is a continuation of Ser. No. 542,180, Jun. 22, 1990, abandoned.

[51] Int. Cl.$^6$ .............................................. H01L 23/367
[52] U.S. Cl. ............................ 438/122; 438/15; 438/123
[58] Field of Search ..................................... 357/81, 79, 74, 357/72; 437/209, 211, 215, 217, 219, 220; 257/675, 706, 712, 713, 48; 438/15, 122, 123

[56] References Cited

U.S. PATENT DOCUMENTS

| | | | |
|---|---|---|---|
| 3,896,544 | 7/1975 | Iosnough | 357/79 |
| 4,459,607 | 7/1984 | Reid | 357/81 |
| 4,620,215 | 10/1986 | Lee | 257/713 |
| 4,688,077 | 8/1987 | Wakabayashi et al. | 357/74 |
| 4,701,999 | 10/1987 | Palmer | 437/211 |
| 4,724,472 | 2/1988 | Sugimoto et al. | 357/74 |
| 4,731,700 | 3/1988 | Woodward et al. | 357/81 |
| 4,742,024 | 5/1988 | Sugimoto et al. | 437/211 |
| 4,796,156 | 1/1989 | Webster . | |
| 4,868,638 | 9/1989 | Hirata et al. | 357/74 |
| 4,876,588 | 10/1989 | Miyamoto | 357/81 |
| 4,887,149 | 12/1989 | Romano | 357/81 |
| 4,890,153 | 12/1989 | Wu | 357/74 |
| 4,918,571 | 4/1990 | Grabbe | 357/81 |
| 4,922,324 | 5/1990 | Sudo | 357/74 |
| 4,926,242 | 5/1990 | Itoh et al. | 357/74 |
| 4,939,570 | 7/1990 | Bickford et al. | 357/81 |
| 4,994,411 | 2/1991 | Naito et al. | 437/209 |
| 5,081,067 | 1/1992 | Shimizu et al. | 437/215 |

FOREIGN PATENT DOCUMENTS

| | | | |
|---|---|---|---|
| 0079238 | 5/1983 | European Pat. Off. | 357/81 |
| 081419 | 6/1983 | European Pat. Off. . | |
| 260370 | 3/1988 | European Pat. Off. . | |
| 382203 | 8/1990 | European Pat. Off. . | |
| 52-37770 | 3/1977 | Japan | 357/74 |
| 0215749 | 12/1984 | Japan | 357/74 |
| 61-4250 | 1/1986 | Japan | 357/74 |
| 0049444 | 3/1986 | Japan | 357/81 |
| 61-48950 | 3/1986 | Japan . | |
| 0291158 | 12/1987 | Japan | 357/74 |
| 62-291158 | 12/1987 | Japan | 357/74 |
| 0173348 | 7/1988 | Japan | 357/74 |
| 63-229843 | 9/1988 | Japan | 357/74 |
| 0262858 | 10/1988 | Japan | 357/74 |
| 63-262858 | 10/1988 | Japan | 357/74 |
| 0089350 | 4/1989 | Japan | 357/74 |
| 1-89350 | 4/1989 | Japan | 357/74 |
| 2076223 | 11/1981 | United Kingdom | 357/74 |

OTHER PUBLICATIONS

IBM Technical Disclosure Bulletin, vol. 19, No. 8, Jan. 1977, p. 2960 J.M. Burry, et al.; "Multidirectional Expansion Packaging".

"Centerless Ceramic Package with Directly Connected Heat Sink"–B.J. Ronkose –IBM Technical Disclosure Bulletin vol. 20, No. 9, Feb. 1978 pp. 3577–3578.

*Primary Examiner*—Peter Toby Brown
*Assistant Examiner*—Kevin Picardat
*Attorney, Agent, or Firm*—Flehr Hohbach Test Albritton & Herbert

[57] ABSTRACT

Semiconductor package and method in which a chip is mounted in an opening in a frame with the back side of the chip facing outside the package, and a heatsink is positioned in direct thermal contact with the back side of the chip. In one preferred method of manufacture, the chip is mounted in the frame and tested before the heatsink is attached.

2 Claims, 3 Drawing Sheets

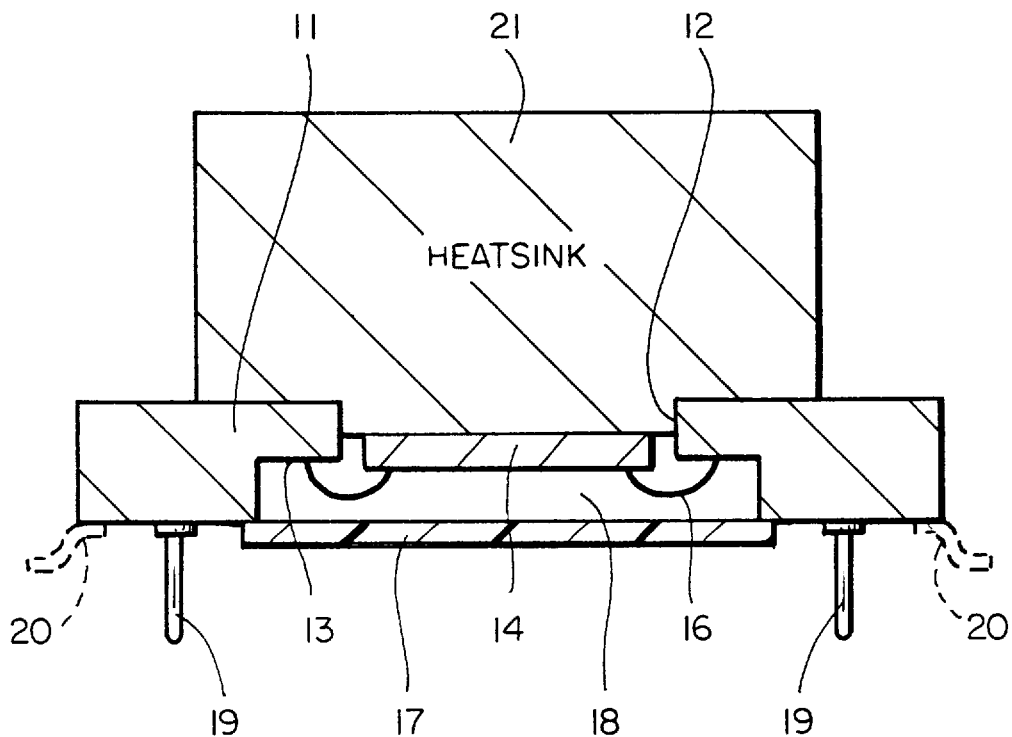
FIG_1
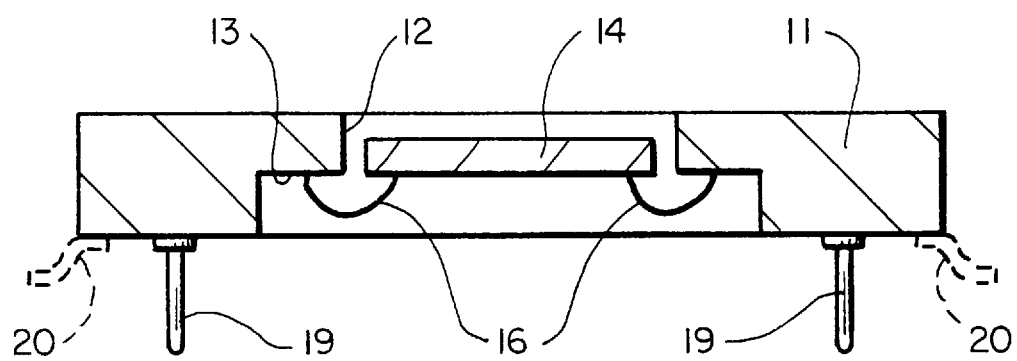
FIG_3

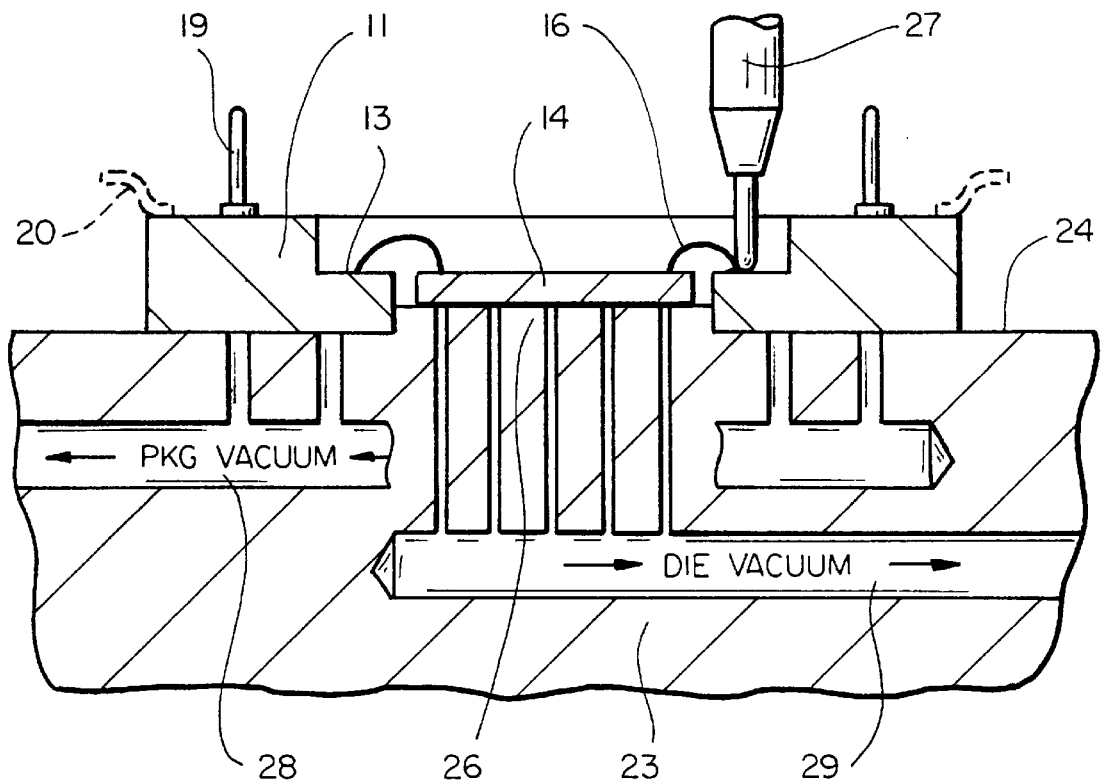
FIG_2
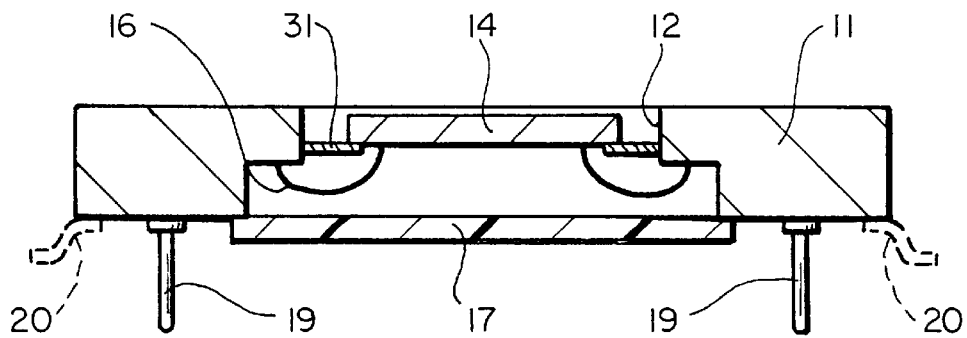
FIG_4

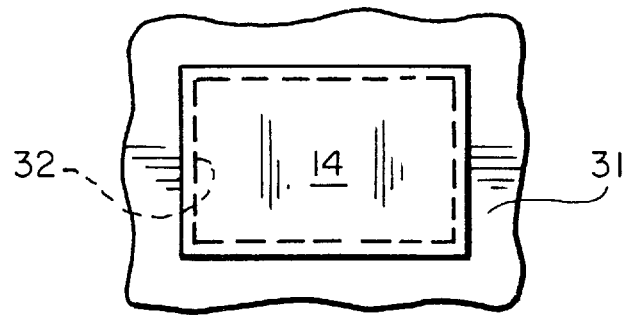
FIG_5
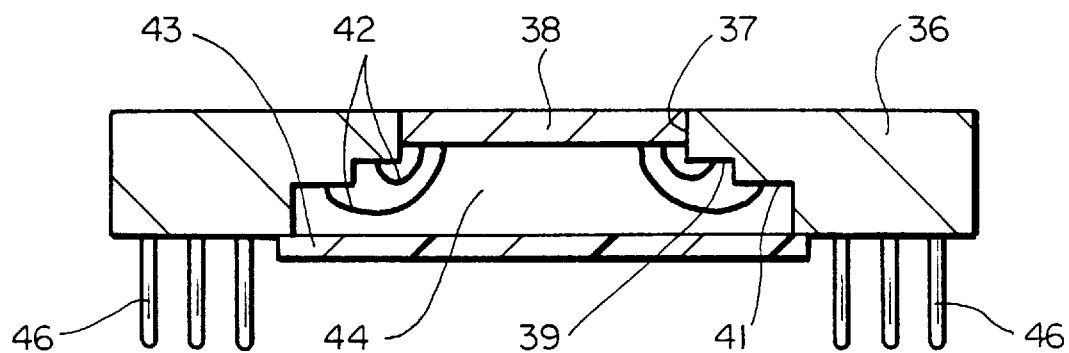
FIG_6
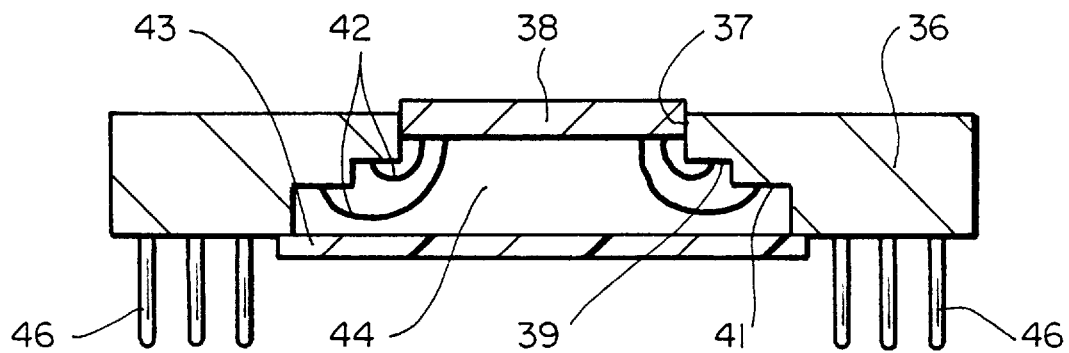
FIG_7

HOLLOW CHIP PACKAGE AND METHOD OF MANUFACTURE

This is a division of application Ser. No. 07/725,376, filed Jun. 27, 1991, now abandoned, which is a continuation of Ser. No. 07/542,180, filed Jun. 22, 1990, now abandoned.

This invention pertains generally to semiconductor devices and, more particularly, to the packaging of a semiconductor chip or die.

High power semiconductor chips commonly require some form of cooling to remove the heat generated by their operation. If allowed to build up, the heat could impair the operation and change the operating characteristics of the devices, damage the devices, and eventually destroy them. The most common means of protecting semiconductors from heat is the use of heatsinks to remove the heat from the devices.

In one type of packaging heretofore employed for high power chips, the chip is attached to the inside of a package with a die-attach material, and the heatsink is attached to the outside of the package. With this arrangement, thermal performance is limited by the thermal resistance of the interfaces and the joints between the chip and the heatsink.

The invention provides an improved semiconductor package and method in which a chip is mounted in an opening in a frame with the back side of the chip facing outside the package, and a heatsink is positioned in direct thermal contact with the back side of the chip. In one preferred method of manufacture, the chip is mounted in the frame and tested before the heatsink is attached.

FIG. 1 is a cross-sectional view of one embodiment of a semiconductor package according to the invention.

FIG. 2 is a fragmentary cross-sectional view of a fixture employed in the assembly of the embodiment of FIG. 1.

FIG. 3 is a cross-sectional view of a partially assembled semiconductor package from the fixture of FIG. 2.

FIG. 4 is a cross-sectional view of another embodiment of a semiconductor package according to the invention.

FIG. 5 is a fragmentary top plan view of the embodiment of FIG. 4.

FIGS. 6 and 7 are cross-sectional views of additional embodiments of semiconductor packages according to the invention.

As illustrated in FIG. 1, the package includes a generally rectangular frame 11 having a generally rectangular central opening 12 with one or more bonding shelves 13 surrounding the opening. A semiconductor chip or die 14 is positioned in the opening, with the top or back side of the chip being exposed to the outside of the package. The opening is of greater lateral extent than the chip, and the chip is thus spaced inwardly from the portion of the frame surrounding the opening. Leads 16 are connected between the bottom or active side of the chip and pads on the bonding shelf of the frame. A cover or lid 17 is affixed to the bottom side of the frame to close the bottom side of the cavity 18 formed by the frame, and pins 19 project from the bottom side of the frame for connection to other circuit elements. Instead of pins 19, the package can have surface mounting leads as indicated by dashed lines 20 for use applications where surface mounting techniques are employed.

A heatsink 21 is bonded to the upper side of the frame and in direct thermal contact with the back side of the chip. The heatsink can be of any suitable type, and can be cooled by any suitable means such as air cooling, liquid cooling, refrigeration, or phase change cooling. In some applications, the bonding leads may hold the chip against the heatsink with sufficient force to provide good thermal contact between the two. In such applications, it is not necessary to bond the heatsink to the chip. In other applications, it may be desirable to use a thermally conductive compound, an adhesive or solder between the heatsink and the chip, or to urge the chip against the heatsink by means of a spring or an elastomer (not shown) pressing against the active face of the chip.

A preferred method of manufacturing the embodiment of FIG. 1 is illustrated in FIG. 2. In this method, the frame 11 and the chip 14 are placed on a fixture 23 having a contour corresponding to the lower portion of the heatsink. Thus, the fixture has a planar surface 24 which receives the upper side of the package in an inverted position, with a raised central area or mandrel 26 which mates with the opening in the frame. The chip is placed on the upper surface of the mandrel with its active side facing in an upward direction, and the bonding leads 16 are attached to the chip and the pads on the frame with a suitable bonding tool 27. The leads can be applied by any suitable technique such as tape automated bonding (TAB), wire or ribbon bonding. During the assembly process, the frame and chip are held in position on the fixture by vacuum applied to passageways 28, 29 which open through the surfaces on which the frame and chip are mounted. If desired, other suitable means such as mechanical means or a temporary adhesive can be utilized to hold the frame and the chip in position during assembly.

Once the bonding leads have been attached, the frame and chip are removed from the fixture, and the leads support the chip in position to receive the heatsink, as illustrated in FIG. 3. Before the heatsink is actually installed, however, the device can be tested electrically. During the testing, the chip can be cooled by temporary means such as a heatsink attached to the chip and frame by vacuum or by direct impingement, traversal or immersion in a coolant. Overheating can also be avoided by using a pulsed testing technique.

By testing the device before an expensive heatsink is installed, a substantial saving in cost can be realized. The chip can be tested at speed, and the heatsink can then be installed, or not, depending upon the outcome of the test. In the case of a microprocessor chip, for example, parts found to have lower operating speeds can be bonded to relatively inexpensive air cooled heatsinks for use in workstations, and parts with higher operating speeds can be bonded to more expensive liquid cooled heatsinks for use in mainframe computers.

Alternatively, in applications where testing prior to heatsink attachment is not required, a more conventional order of assembly can be employed. For example, the heatsink can be bonded to the frame first, then the chip can be attached to the heatsink, and thereafter the bonding leads can be attached.

The embodiment of FIG. 4 is generally similar to the embodiment of FIG. 1, and like reference numerals designate corresponding elements in the two embodiments.

In the embodiment of FIG. 4, however, the chip 14 is mounted to the frame by a metal foil 31 which has a cut-out area slightly smaller than the chip. The outer periphery of the foil is bonded to the frame 11, and the inner periphery of the foil is affixed to the peripheral portion of the active surface of the chip. As in the embodiment of FIG. 1, the back side of the chip is exposed to the outside of the package. The back side of the chip can be recessed as shown in FIG. 4, or it can be made positioned flush with the back side of the frame, or it can project from the frame. A hermetic seal between the foil and the active face of the chip can be made by any suitable means such as laser welding, brazing or soldering. With the chip bonded to the frame by its front face, the entire back side of the chip is free for contact with the heatsink.

In the embodiment of FIG. 6, the chip is bonded to the frame by its edge portions, and the entire back side of the chip is again available for direct contact with a heatsink. In this embodiment, the frame 36 has an opening 37 which corresponds closely in size to the lateral dimensions of a chip 38, and the edge portions of the chip are bonded to the frame by suitable means such as soldering or brazing, with the back side of the chip flush with the top or back side of the frame. Frame 36 has two bonding shelves 39, 41, and bonding leads 42 are connected between the active side of the chip and bonding pads on both of these shelves. A lid or cover 43 is affixed to the bottom side of the frame to close the internal cavity 44, and connector pins 46 project from the bottom side of the frame. As in the other embodiments, surface mounting leads can be utilized instead of connector pins 46, if desired.

The embodiment of FIG. 7 is similar to the embodiment of FIG. 6, except that the chip 38 projects from the top or back side of the frame 38, with the back side of the chip being offset to the rear of the back of the frame. In both of these embodiments, the entire back side of the chip is again exposed for contact with the heatsink, and in the embodiment of FIG. 7, the offset facilitates attachment of the heatsink.

It is apparent from the foregoing that a new and improved semiconductor package and method have been provided. While only certain presently preferred embodiments have been described in detail, as will be apparent to those familiar with the art, certain changes and modifications can be made without departing from the scope of the invention as defined by the following claims.

I claim:

1. In a semiconductor packaging method, the steps of: placing a chip and a frame on a fixture having a plurality of vacuum passageways communicating with surfaces of the chip and frame, applying a vacuum to the passageways to hold the chip and the frame on the fixture with the back side of the chip facing the fixture, connecting electrical leads to the chip and to bonding pads carried by the frame while the chip and frame are held on the fixture, releasing the vacuum and removing the chip and the frame from the fixture as a unit after the bonding leads are connected, and thereafter installing a heatsink in direct thermal contact with the back side of the chip.

2. The method of claim 1 including the step of applying test signals to the electrical leads before the heatsink is installed.

* * * * *